(12) United States Patent
Freer et al.

(10) Patent No.: US 10,386,401 B2
(45) Date of Patent: Aug. 20, 2019

(54) ELECTRICAL NETWORK INSPECTION DEVICES

(71) Applicant: Cooper Technologies Company, Houston, TX (US)

(72) Inventors: Benjamin Avery Freer, Syracuse, NY (US); Joseph Michael Manahan, Manlius, NY (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 0 days.

(21) Appl. No.: 15/645,459

(22) Filed: Jul. 10, 2017

(65) Prior Publication Data

US 2018/0011134 A1 Jan. 11, 2018

Related U.S. Application Data

(60) Provisional application No. 62/360,108, filed on Jul. 8, 2016.

(51) Int. Cl.
  *G01R 31/02* (2006.01)
  *G01R 31/04* (2006.01)
  *G01R 31/333* (2006.01)

(52) U.S. Cl.
  CPC .......... *G01R 31/025* (2013.01); *G01R 31/02* (2013.01); *G01R 31/04* (2013.01); *G01R 31/3333* (2013.01)

(58) Field of Classification Search
  CPC .................................................... G01R 31/04
  See application file for complete search history.

(56) References Cited

U.S. PATENT DOCUMENTS

| 4,885,564 A | 12/1989 | Vercellotti et al. |
| 5,552,701 A | 9/1996 | Veteran et al. |
| 5,682,472 A * | 10/1997 | Brehm ................... G11C 29/10 714/25 |

(Continued)

FOREIGN PATENT DOCUMENTS

WO 2013126612 8/2013

OTHER PUBLICATIONS

S. Pudov, International Search Report and Written Opinion issued in application PCT/US2017/041360, completion date Oct. 10, 2017, dated Oct. 26, 2017, 8 pages, Federal Institute of Industrial Property, Moscow, Russia.

(Continued)

*Primary Examiner* — Clayton E. LaBalle
*Assistant Examiner* — Jas A Sanghera
(74) *Attorney, Agent, or Firm* — King & Spalding LLP

(57) ABSTRACT

An electrical system can include a diagnostic device that generates a first test signal. The electrical system can also include multiple energy transfer links coupled to the diagnostic device, where the first test signals flows through a first subset of the energy transfer links. The electrical system can further include a first monitoring device coupled to the first subset of energy transfer links, where the first monitoring device receives the first test signal from the diagnostic device through the first subset of the energy transfer links. The electrical system can also include a first electrical device coupled to the first monitoring device. The first monitoring device can implement a first test procedure based on the first test signal, where the first test procedure helps determine a first condition of the first electrical device.

20 Claims, 6 Drawing Sheets

(56) References Cited

U.S. PATENT DOCUMENTS

| | | |
|---|---|---|
| 6,516,053 B1 | 2/2003 | Ryan et al. |
| 6,992,872 B2 | 1/2006 | Morris et al. |
| 7,042,243 B2* | 5/2006 | Matsumoto ........ G01R 31/2851 |
| | | 324/762.01 |
| 7,124,003 B1 | 10/2006 | West et al. |
| 7,259,565 B2 | 8/2007 | Diercks et al. |
| 7,281,161 B2 | 10/2007 | Titmuss |
| 7,282,921 B2 | 10/2007 | Sela et al. |
| 7,633,185 B2 | 12/2009 | Rowell |
| 8,736,297 B2 | 5/2014 | Yelgin |
| 9,037,917 B2 | 5/2015 | Wilson et al. |
| 9,285,427 B2 | 3/2016 | Luo et al. |
| 9,354,268 B2 | 5/2016 | Teggatz et al. |
| 9,413,156 B2 | 8/2016 | O'Brien et al. |
| 9,482,711 B2 | 11/2016 | Abouda et al. |
| 2007/0140474 A1* | 6/2007 | Fertner ................ H04M 3/306 |
| | | 379/398 |
| 2008/0291850 A1 | 11/2008 | Jensen |
| 2010/0097733 A1 | 4/2010 | E. |
| 2012/0319718 A1* | 12/2012 | Kim ................ G01R 31/31908 |
| | | 324/762.01 |
| 2015/0073733 A1 | 3/2015 | Agapiou et al. |
| 2016/0141123 A1 | 5/2016 | Jefferies et al. |
| 2016/0178682 A1 | 6/2016 | Eldridge et al. |
| 2016/0187400 A1* | 6/2016 | Ji ........................ G01R 22/10 |
| | | 324/107 |
| 2017/0184343 A1 | 6/2017 | Freer et al. |

OTHER PUBLICATIONS

A. Semenova, International Search Report and Written Opinion issued in application PCT/US2017/041368, completion date Oct. 26, 2017, dated Nov. 9, 2017, 7 pages, Federal Institute of Industrial Property, Moscow, Russia.

* cited by examiner

ELECTRICAL NETWORK INSPECTION DEVICES

CROSS-REFERENCE TO RELATED APPLICATIONS

This application claims priority under 35 U.S.C. § 119 to U.S. Provisional Patent Application Ser. No. 62/360,108, titled "Electrical Network Inspection Devices" and filed on Jul. 8, 2016, the entire contents of which are hereby incorporated herein by reference.

TECHNICAL FIELD

The present disclosure relates generally to electrical systems, and more particularly to systems, methods, and devices for automatically inspecting electrical systems.

BACKGROUND

An electrical system can have a large number (e.g., hundreds, thousands, hundreds of thousands) of electrical connections. In such systems, a single voltage rail or bus can be connected to a large number of devices. When wiring has been completed, it is difficult to verify that every electrical connection has been made correctly (e.g., terminated at the proper point of termination, securely terminated) until after the devices are put into operation. In addition, during outages of in-service equipment, it is not always clear what devices in an electrical system require maintenance.

SUMMARY

In general, in one aspect, the disclosure relates to an electrical system. The electrical system can include a diagnostic device that generates a first test signal. The electrical system can also include multiple energy transfer links coupled to the diagnostic device, where the first test signal flows through a first subset of the energy transfer links. The electrical system can further include a first monitoring device coupled to the first subset of the energy transfer links, where the first monitoring device receives the first test signal from the diagnostic device through the first subset of the energy transfer links. The electrical system can also include a first electrical device coupled to the first monitoring device. The first monitoring device implements a first test procedure based on the first test signal, where the first test procedure helps determine a first condition of the first electrical device.

In another aspect, the disclosure can generally relate to a monitoring device for a portion of an electrical system. The monitoring device can include a monitoring engine that can be configured to receive, on a subset of energy transfer links, a test signal from a diagnostic device of the electrical system. The monitoring engine can also be configured to implement, in response to the test signal, a test procedure on a downstream electrical device of the electrical system using the subset of the energy transfer links. The monitoring engine can further be configured to send a return signal to the diagnostic device, where the return signal includes results of the test procedure on the downstream electrical device. The diagnostic device can be configured to determine a condition of the electrical device using the results included in the return signal.

In yet another aspect, the disclosure can generally relate to a method for testing an electrical device of an electrical system. The method can include receiving, on a subset of energy transfer links, a test signal from a diagnostic device of the electrical system. The method can also include implementing, in response to the test signal, a test procedure on a downstream electrical device of the electrical system using the subset of the energy transfer links. The method can further include sending a return signal to the diagnostic device, where the return signal comprises results of the test procedure on the downstream electrical device. The diagnostic device can be configured to determine a condition of the electrical device using the results included in the return signal.

These and other aspects, objects, features, and embodiments will be apparent from the following description and the appended claims.

BRIEF DESCRIPTION OF THE DRAWINGS

The drawings illustrate only example embodiments and are therefore not to be considered limiting in scope, as the example embodiments may admit to other equally effective embodiments. The elements and features shown in the drawings are not necessarily to scale, emphasis instead being placed upon clearly illustrating the principles of the example embodiments. Additionally, certain dimensions or positions may be exaggerated to help visually convey such principles. In the drawings, reference numerals designate like or corresponding, but not necessarily identical, elements.

DETAILED DESCRIPTION

Figure 1:
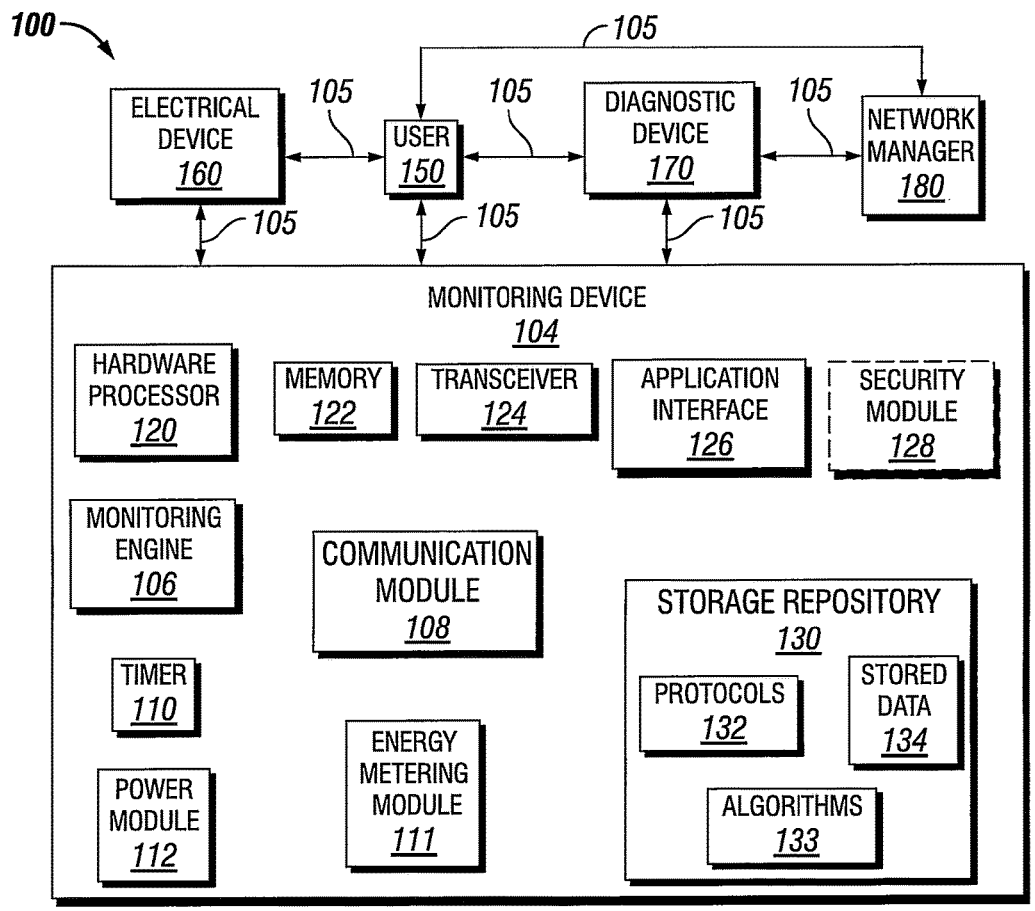
FIG. 1 shows a system diagram of an electrical network that includes a monitoring device in accordance with certain example embodiments.

The example embodiments discussed herein are directed to systems, methods, and devices for inspecting some or all of an electrical network. An electrical network that is inspected using example embodiments can include any of a number of different devices. Such devices can include, but are not limited to, a motor, a contactor, a breaker, a relay, a transformer, a controller, a terminal block, a cable, a wall outlet, and a heater. The number of devices in an electrical network that is inspected using example embodiments can also vary, from a single device to multiple devices.

Also, while example embodiments are described herein as inspecting electrical networks that operate at 600 VAC or less, example inspection devices can be used to inspect electrical networks that operate at voltages above 600 VAC. Further, example embodiments are described as testing electrical networks when those electrical networks are idle. In some cases, a portion of an electrical network can be isolated (placed idle) so that example embodiments can inspect that portion of the electrical network, while the rest of the electrical network remains in service. While example inspection devices can be used with electrical networks (or portions thereof) that are in service (energized), those devices can monitor conditions associated with one or more devices without inspecting such devices. In this way, Example inspection devices can be left permanently in place in an electrical network. Alternatively, example inspection devices can be inserted into a de-energized electrical network on a temporary basis, strictly for the purposes of inspecting the electrical network.

In the foregoing figures showing example embodiments of inspecting electrical networks, one or more of the components shown may be omitted, repeated, and/or substituted. Accordingly, example embodiments of inspecting electrical networks should not be considered limited to the specific arrangements of components shown in any of the figures. For example, features shown in one or more figures or described with respect to one embodiment can be applied to another embodiment associated with a different figure or description.

In certain example embodiments, electrical networks that are inspected are subject to meeting certain standards and/or requirements. For example, the National Electric Code (NEC), the National Electrical Manufacturers Association (NEMA), the International Electrotechnical Commission (IEC), the Federal Communication Commission (FCC), the Illuminating Engineering Society (IES), and the Institute of Electrical and Electronics Engineers (IEEE) set standards as to electrical enclosures, wiring, and electrical connections. Use of example embodiments described herein meet (and/or allow a corresponding device to meet) such standards when required. In some (e.g., PV solar) applications, additional standards particular to that application may be met by the electrical networks described herein.

If a component of a figure is described but not expressly shown or labeled in that figure, the label used for a corresponding component in another figure can be inferred to that component. Conversely, if a component in a figure is labeled but not described, the description for such component can be substantially the same as the description for the corresponding component in another figure. The numbering scheme for the various components in the figures herein is such that each component is a three digit number and corresponding components in other figures have the identical last two digits.

Further, a statement that a particular embodiment (e.g., as shown in a figure herein) does not have a particular feature or component does not mean, unless expressly stated, that such embodiment is not capable of having such feature or component. For example, for purposes of present or future claims herein, a feature or component that is described as not being included in an example embodiment shown in one or more particular drawings is capable of being included in one or more claims that correspond to such one or more particular drawings herein.

Example embodiments of inspecting electrical networks will be described more fully hereinafter with reference to the accompanying drawings, in which example embodiments of inspecting electrical networks are shown. Inspecting electrical networks may, however, be embodied in many different forms and should not be construed as limited to the example embodiments set forth herein. Rather, these example embodiments are provided so that this disclosure will be thorough and complete, and will fully convey the scope of inspecting electrical networks to those of ordinary skill in the art. Like, but not necessarily the same, elements (also sometimes called components) in the various figures are denoted by like reference numerals for consistency.

Terms such as "first", "second", and "within" are used merely to distinguish one component (or part of a component or state of a component) from another. Such terms are not meant to denote a preference or a particular orientation, and are not meant to limit embodiments of inspecting electrical networks. In the following detailed description of the example embodiments, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

FIG. 1 shows a system diagram of an electrical network 100 that includes a monitoring device 104 (also referred to herein as an inspection device) in accordance with certain example embodiments. The electrical network 100 (also referred to herein as a network 100) can include one or more electrical devices 160, a user 150, a network manager 180, and a diagnostic device 170.

The monitoring device 104 can include one or more of a number of components. Such components, can include, but are not limited to, a monitoring engine 106, a communication module 108, a timer 110, an energy metering module 111, a power module 112, a storage repository 130, a hardware processor 120, a memory 122, a transceiver 124, an application interface 126, and, optionally, a security module 128. The components shown in FIG. 1 are not exhaustive, and in some embodiments, one or more of the components shown in FIG. 1 may not be included in an example monitoring device 104. Any component of the example monitoring device 104 can be discrete or combined with one or more other components of the monitoring device 104.

A user 150 may be any person that interacts with electrical systems 150. Examples of a user 150 can include, but are not limited to, an engineer, an electrician, an instrumentation and controls technician, a mechanic, an operator, a consultant, an inventory management system, an inventory manager, a foreman, a labor scheduling system, a contractor, and a manufacturer's representative. The user 150 can use a user system (not shown), which may include a display (e.g., a GUI). The user 150 interacts with (e.g., sends data to, receives data from) the monitoring device 104 via the application interface 126 (described below). The user 150 can also interact with the network manager 180, the diagnostic device 170, and/or one or more of the electrical devices 160 in the network 100. Interaction between the user 150 and the network manager 180, the monitoring device 104 and the electrical devices 160 can be conducted using one or more energy transfer links 105. Each energy transfer link 105 can include wired (e.g., Class 1 electrical cables, Class 2 electrical cables, electrical connectors, power line carrier, RS485) and/or wireless (e.g., Wi-Fi, visible light communication, cellular networking, Bluetooth, WirelessHART, ISA100) technology. The energy transfer link 105 can transmit signals (e.g., power signals, communication signals, control signals, data) between (and even within) the user 150, the network manager 180, the monitoring device 104 and the electrical devices 160.

The diagnostic device 170 can receive power for performing testing operations via a power source. The diagnostic device 170 can create (using, for example, transformers, inverters, converters, diode bridges) a level and type of power (referred to herein as test signals) that is used for testing one or more electrical devices 160 using the monitoring device 104. For example, the diagnostic device 170 can generate and send low voltage (e.g., 24 V DC power) test signals through one or more energy transfer links 105 to the monitoring device 104. The diagnostic device 170 can also include an energy metering module, which can be substantially similar to the energy metering module 111 described herein with respect to the monitoring device 104. In certain example embodiments, the diagnostic device 170 is coupled to multiple monitoring devices 104 at once so that multiple electrical devices 160 can be monitored and tested.

The diagnostic device 170 can transmit test signals (e.g., voltage, current) onto one or more energy transfer links 105 to a monitoring device 104. The diagnostic device 170 can also include one or more components for evaluating the electrical and/or mechanical integrity of the electrical device 160 (including associated equipment). For example, the diagnostic device 170 can include one or more components for ground fault testing. As another example, the diagnostic device 170 can include a temperature sensor for detecting temperature increases that may indicate an unsafe condition. As yet another example, the diagnostic device 170 can detect and measure a voltage drop to and from each monitoring device 104, which allows the diagnostic device 170 to determine the AC line impedance relative to each monitoring device 104.

In certain example embodiments, the test signals generated by the diagnostic device 170 can be addressable and/or include specific instructions for a recipient monitoring device 104. The addressability of a test signal can be based on any of a number of factors, including but not limited to a unique identification number of a monitoring device 104, a frequency, and a passage of time. The diagnostic device 170 can be used when some or all of the electrical devices 160 in the system 100 are in service. In such a case, however, the diagnostic device 170 may only be used to monitor electrical conditions that flow therethrough. In other words, the diagnostic device 170 may only be able to generate test signals when the portion of the system 100 in which the diagnostic device 170 is located is idle.

As defined herein, the term "idle" refers to any equipment (electrical device) that is not operating under its intended purpose at that point in time, regardless of the reason. Examples of times when equipment is idle can include, but are not limited to, during an outage, when the equipment is capable of operation but is not receiving power to operate, and when the equipment is capable of operation but the operation is temporarily interrupted (e.g., for testing). In other words, equipment that is idle can be capable of immediate operation but is not operating at that particular point in time. Idle equipment can also be equipment that is under repair.

The network manager 180 is a device or component that controls all or a portion of the electrical system 100 that includes the monitoring device 104. The network manager 180 can be substantially similar to the diagnostic device 170. Alternatively, the network manager 180 can include one or more of a number of features in addition to, or altered from, the features of the diagnostic device 170 described below. As described herein, communication with the network manager 180 can include communicating with one or more other components (e.g., another diagnostic device 170) of the network 100. In such a case, the network manager 180 can facilitate such communication.

The one or more electrical devices 160 can be any type of device that uses electricity to operate. Examples of electrical devices 160 can include, but are not limited to, a motor, a contactor, a circuit breaker, a relay, a transformer, a controller, a terminal block, a cable, a wall outlet, a light fixture, and a heater.

Each monitoring device 104 can use one or more of a number of communication protocols. A monitoring device 104 can be located within the housing of an electrical device 160, disposed on the housing of an electrical device 160, or located outside the housing of an electrical device 160. In some cases, a single monitoring device 104 can be used to inspect or test more than one electrical device 160. In certain example embodiments, a monitoring device 104 can include a battery that is used to provide power, at least in part, to some or all of the monitoring device 104. The monitoring device 104 can be integrated with and/or coupled to an electrical device 160 in one or more of a number of ways. For example, the monitoring device 104 can be disposed within a potted enclosure. As another example, the monitoring device 104 can integrated with a terminal block or a plug assembly. As yet another example, the monitoring device 104 can integrated with a contactor.

The user 150, the network manager 180, one or more electrical devices 160, and/or the diagnostic device 170 can interact with the monitoring device 104 using the application interface 126 in accordance with one or more example embodiments. Specifically, the application interface 126 of the monitoring device 104 receives data (e.g., information, communications, instructions, updates to firmware) from and sends data (e.g., information, communications, instructions) to the user 150, the network manager 180, one or more electrical devices 160, and/or the diagnostic device 170. The user 150, the network manager 180, one or more electrical devices 160, and/or the diagnostic device 170 can include an interface to receive data from and send data to the monitoring device 104 in certain example embodiments. Examples of such an interface can include, but are not limited to, a graphical user interface, a touchscreen, an application programming interface, a keyboard, a monitor, a mouse, a web service, a data protocol adapter, some other hardware and/or software, or any suitable combination thereof.

The monitoring device 104, the user 150, the network manager 180, one or more electrical devices 160, and/or the diagnostic device 170 can use their own system or share a system in certain example embodiments. Such a system can be, or contain a form of, an Internet-based or an intranet-based computer system that is capable of communicating with various software. A computer system includes any type of computing device and/or communication device, including but not limited to the monitoring device 104. Examples of such a system can include, but are not limited to, a desktop computer with Local Area Network (LAN), Wide Area Network (WAN), Internet or intranet access, a laptop computer with LAN, WAN, Internet or intranet access, a smart phone, a server, a server farm, an android device (or equivalent), a tablet, smartphones, and a personal digital assistant (PDA). Such a system can correspond to a computer system as described below with regard to FIG. 2.

Further, as discussed above, such a system can have corresponding software (e.g., user software, auto commissioning system software, network manager software). The software can execute on the same or a separate device (e.g., a server, mainframe, desktop personal computer (PC), laptop, PDA, television, cable box, satellite box, kiosk, telephone, mobile phone, or other computing devices) and can be coupled by the communication network (e.g., Internet, Intranet, Extranet, LAN, WAN, or other network communication methods) and/or communication channels, with wire and/or wireless segments according to some example embodiments. The software of one system can be a part of, or operate separately but in conjunction with, the software of another system within the network 100.

The monitoring device 104 can include a housing. The housing can include at least one wall that forms a cavity. In some cases, the housing of the monitoring device 104 can be designed to comply with any applicable standards so that the monitoring device 104 can be located in a particular environment (e.g., a hazardous environment). The housing of the monitoring device 104 can be used to house one or more components of the monitoring device 104. For example, the monitoring engine 106, the communication module 108, the timer 110, the energy metering module 111, the power module 112, the storage repository 130, the hardware processor 120, the memory 122, the transceiver 124, the application interface 126, and the optional security module 128 can be disposed in a cavity formed by a housing. In alternative embodiments, any one or more of these or other components of the monitoring device 104 can be disposed on the housing and/or remotely from the housing.

The storage repository 130 can be a persistent storage device (or set of devices) that stores software and data used to assist the monitoring device 104 in communicating with the user 150, the network manager 180, one or more electrical devices 160, and/or the diagnostic device 170 within the network 100. In one or more example embodiments, the storage repository 130 stores one or more protocols 132, algorithms 133, and stored data 134. The protocols 132 can be any of a number of communication protocols that are used to send and/or receive data between the monitoring device 104, the user 150, the network manager 180, one or more electrical devices 160, and/or the diagnostic device 170. A protocol 132 can also include a process for testing one or more electrical devices 160 in the network 100. A protocol 132 can be used for wired and/or wireless communication. Examples of a protocol 132 can include, but are not limited to, Modbus, profibus, Ethernet, and fiberoptic. One or more of the protocols 132 can be a time-synchronized protocol. Examples of such time-synchronized protocols can include, but are not limited to, a highway addressable remote transducer (HART) protocol, a wirelessHART protocol, and an International Society of Automation (ISA) 100 protocol. In this way, one or more of the protocols 132 can provide a layer of security to the data transferred within the network 100.

The algorithms 133 can be any procedures (e.g., a series of method steps), formulas, logic steps, mathematical models, and/or other similar operational procedures that the monitoring engine 106 of the monitoring device 104 follows based on certain conditions at a point in time. An algorithm 133 can be fixed or modified (e.g., by a user 150, by the monitoring engine 106) over time. Modification of an algorithm 133 can be based on one or more of a number of factors, including but not limited to new equipment (e.g., a new transceiver 124) and correction based on actual data.

Stored data 134 can be any data (e.g., processing speed) associated with one or more electrical devices 160, measurements taken by the energy metering module 111, threshold values (e.g., percent change, numerical values), results of previously run or calculated algorithms 133, and/or any other suitable data. Such data can be any type of data, including but not limited to historical data for the electrical devices 160, calculations, an identification number of an electrical device 160, measurements taken by the energy metering module 111, and measurements taken by the diagnostic device 170. The stored data 134 can be associated with some measurement of time derived, for example, from the timer 110.

Examples of a storage repository 130 can include, but are not limited to, a database (or a number of databases), a file system, a hard drive, flash memory, some other form of solid state data storage, or any suitable combination thereof. The storage repository 130 can be located on multiple physical machines, each storing all or a portion of the protocols 132, the algorithms 133, and/or the stored data 134 according to some example embodiments. Each storage unit or device can be physically located in the same or in a different geographic location.

The storage repository 130 can be operatively connected to the monitoring engine 106. In one or more example embodiments, the monitoring engine 106 includes functionality to communicate with the user 150, the network manager 180, the diagnostic device 170, and the electrical devices 160 in the network 100. More specifically, the monitoring engine 106 sends information to and/or receives information from the storage repository 130 in order to communicate with the user 150, the network manager 180, the diagnostic device 170, and the electrical devices 160. As discussed below, the storage repository 130 can also be operatively connected to the communication module 108 in certain example embodiments.

In certain example embodiments, the monitoring engine 106 of the monitoring device 104 controls the operation of one or more components (e.g., the communication module 108, the timer 110, the transceiver 124) of the monitoring device 104. For example, the monitoring engine 106 can activate the communication module 108 when the communication module 108 is in "sleep" mode and when the communication module 108 is needed to send data received from another component (e.g., the diagnostic device 170, the user 150) in the network 100.

As another example, the monitoring engine 106 can acquire the current time using the timer 110. The timer 110 can enable the monitoring device 104, even when the monitoring device 104 has no communication with the electrical devices 160, the diagnostic device 170, and/or the user 150. As yet another example, the monitoring engine 106 can direct the energy metering module 111 to measure and send power consumption information of a circuit associated with an electrical device 160 to the diagnostic device 170.

The monitoring engine 106 can be configured to perform a number of functions that help inspect one or more of the electrical devices 160 in the network 100. For example, the monitoring engine 106 can apply a short to two or more energy transfer links 105. As discussed above, the monitoring engine 106 can execute any of the algorithms 133 stored in the storage repository 130. In certain example embodiments, the monitoring engine 106 can perform a number of functions, such as applying an electrical short to one or more electrical conductors (e.g., an energy transfer link 105 that feeds an electrical device 160), measuring an impedance on an electrical conductor, detecting an open and/or a short on an electrical conductors in the network 100.

In certain example embodiments, the monitoring engine 106 can also monitor one or more parameters (e.g., resistance, impedance) of an electrical device 160 over time. In such a case, early stages of deterioration of the electrical device 160 can be identified and addressed before a problem becomes so severe that the electrical device 160 fails. The values of these parameters can be stored in the storage repository as stored data 134. These parameters can be taken at any time (e.g., upon installation, weekly, annually). Any signals sent by the monitoring engine 106 of the monitoring device 104 to the diagnostic device 170 can be called return signals and can include information such as identification of the monitoring device 104, identification of the downstream electrical device 160, historical data, results of a test procedure, fault conditions detected, and/or any other suitable information.

The monitoring engine 106, as well as other components of a monitoring device 104, can operate only when a downstream electrical device 160 is idle and when the monitoring device receives a test signal from the diagnostic device 170. In other embodiments, in addition to times when the downstream electrical device 160 is idle, a monitoring device 104 can operate when the downstream electrical device 160 is operating. During the latter scenario, the monitoring device 104 is unable to communicate using a return signal, as when the downstream electrical device 160 is idle. In such a case, the power module 112 of the monitoring device 104 can include an energy storage device (e.g., a battery, a supercapacitor) or other source of power that allows the monitoring device 104 (using the transceiver 124) to communicate with the diagnostic device 170 using wireless communication technology.

In certain example embodiments, the monitoring engine 106 can have one or more of a number of safety features included. For example, before an idle downstream electrical device 160 can receive system power, the monitoring engine 106 can lock out the downstream electrical device 160 until certain test procedures have been run by the monitoring engine 106, the diagnostic device 170 has interpreted the results of those test procedures, and the diagnostic device 170 has determined that the electrical device 160 is reasonably safe for being put back into service.

The monitoring engine 106 can provide control, communication, and/or other similar signals to the user 150, the diagnostic device 170, and one or more of the electrical devices 160. Similarly, the monitoring engine 106 can receive control, communication, and/or other similar signals from the user 150, the diagnostic device 170, and one or more of the electrical devices 160. The monitoring engine 106 can inspect each electrical device 160 automatically (for example, based on one or more protocols 132 stored in the monitoring engine 106) and/or based on control, communication, and/or other similar signals received from another device (e.g., the diagnostic device 170) through an energy transfer link 105. The monitoring engine 106 may include a printed circuit board, upon which the hardware processor 120 and/or one or more discrete components of the monitoring device 104 are positioned.

In certain embodiments, the monitoring engine 106 of the monitoring device 104 can communicate with one or more components of a system external to the network 100 in furtherance of inspecting electrical devices 160 in the network 100. For example, the monitoring engine 106 can interact with an inventory management system by ordering a replacement part for an electrical device 160 that the monitoring engine 106 has determined to fail or be failing. As another example, the monitoring engine 106 can interact with a workforce scheduling system by scheduling a maintenance crew to repair or replace an electrical device 160 (or portion thereof) when the monitoring engine 106 determines that the electrical device 160 or portion thereof requires maintenance or replacement. In this way, the monitoring device 104 is capable of performing a number of functions beyond what could reasonably be considered a routine task.

The monitoring engine 106 (or other components of the monitoring device 104) can also include one or more hardware components and/or software elements to perform its functions. Such components can include, but are not limited to, a universal asynchronous receiver/transmitter (UART), a serial peripheral interface (SPI), a direct-attached capacity (DAC) storage device, an analog-to-digital converter, an inter-integrated circuit ($I^2C$), and a pulse width modulator (PWM).

The communication module 108 of the monitoring device 104 determines and implements the communication protocol (e.g., from the protocols 132 of the storage repository 130) that is used when the monitoring engine 106 communicates with (e.g., sends signals to, receives signals from) the user 150, the diagnostic device 170, and/or one or more of the electrical devices 160. In addition, the communication module 108 can interpret the communication protocol of a communication received by the monitoring device 104 so that the monitoring engine 106 can interpret the communication.

The communication module 108 can send and receive data between the diagnostic device 170, the electrical devices 160, and/or the users 150 and the monitoring device 104. The communication module 108 can send and/or receive data in a given format that follows a particular protocol 132. The monitoring engine 106 can interpret the data packet received from the communication module 108 using the protocol 132 information stored in the storage repository 130. The monitoring engine 106 can also facilitate the data transfer with one or more electrical devices 160, the diagnostic device 170, and/or a user 150 by converting the data into a format understood by the communication module 108.

The communication module 108 can send data (e.g., protocols 132, algorithms 133, stored data 134, operational information, alarms) directly to and/or retrieve data directly from the storage repository 130. Alternatively, the monitoring engine 106 can facilitate the transfer of data between the communication module 108 and the storage repository 130. The communication module 108 can also provide encryption to data that is sent by the monitoring device 104 and decryption to data that is received by the monitoring device 104. The communication module 108 can also provide one or more of a number of other services with respect to data sent from and received by the monitoring device 104. Such services can include, but are not limited to, data packet routing information and procedures to follow in the event of data interruption.

The timer 110 of the monitoring device 104 can track clock time, intervals of time, an amount of time, and/or any other measure of time. The timer 110 can also count the number of occurrences of an event, whether with or without respect to time. Alternatively, the monitoring engine 106 can perform the counting function. The timer 110 is able to track multiple time measurements concurrently. The timer 110 can track time periods based on an instruction received from the monitoring engine 106, based on an instruction received from the user 150, based on an instruction programmed in the software for the monitoring device 104, based on some other condition or from some other component, or from any combination thereof.

The timer 110 can be configured to track time when there is no power delivered to the monitoring device 104 (e.g., the power module 112 malfunctions) using, for example, a super capacitor or a battery backup. In such a case, when there is a resumption of power delivery to the monitoring device 104, the timer 110 can communicate any aspect of time to the monitoring device 104. In such a case, the timer 110 can include one or more of a number of components (e.g., a super capacitor, an integrated circuit) to perform these functions.

The energy metering module 111 of the monitoring device 104 measures one or more components of power (e.g., current, voltage, resistance, impedance, VARs, watts) at one or more electrical conductors (a type of energy transfer link 105) feeding one or more electrical devices 160. The energy metering module 111 can include any of a number of measuring devices and related devices, including but not limited to a voltmeter, an ammeter, a power meter, an ohmmeter, a current transformer, a potential transformer, and electrical wiring. The energy metering module 111 can measure a component of power continuously, periodically, based on the occurrence of an event, based on a command received from the control module 106, and/or based on some other factor.

The power module 112 of the monitoring device 104 provides power to one or more other components (e.g., timer 110, monitoring engine 106) of the monitoring device 104. The power module 112 can also generate power (e.g., current source, voltage source) that is used to test one or more electrical devices 160. For example, the power module 112 can control a current set point that flows through part (e.g., an electrical device 160) of the electrical system 100 for testing (inspecting) one or more electrical devices 160 of the system 100.

In some cases, the power module 112 can control multiple current set points, where the monitoring engine 106 can dictate which current set point is used at a given point in time. For example, during normal operating conditions, the power module 112 of the can have the current set point be very low (e.g., 1.2 mA). Alternatively, during times when the downstream electrical device 160 is out of service, the power module 112 of the can have the current set point be relatively high (e.g., 7 mA). In this way, when the downstream electrical device 160 is out of service or otherwise idle and the diagnostic device 170 is sending test signals to the monitoring device 104, the power module 112 can generate a predictable and noticeable load current. This high current set point can be measured at the diagnostic device 170 due to the high impedance (a known value) of the diagnostic device 170. This allows for several volts of signal to transfer data between the diagnostic device 170 and the monitoring device 104.

The power module 112 can include one or more of a number of single or multiple discrete components (e.g., transistor, diode, resistor, fuse, capacitor), and/or a microprocessor. The power module 112 may include a printed circuit board, upon which the microprocessor and/or one or more discrete components are positioned. In some cases, the power module 112 can include one or more components that allow the power module 112 to measure one or more elements of power (e.g., voltage, current) that is delivered to and/or sent from the power module 112, Alternatively, the monitoring device 104 can include a power metering module (not shown) to measure one or more elements of power that flows into, out of, and/or within the monitoring device 104. The power module 112 can receive its power from the diagnostic device 170.

The power module 112 can include one or more components (e.g., a transformer, a diode bridge, an inverter, a converter) that receives power (for example, through an electrical cable) from a source (e.g., the diagnostic device 170) external to the monitoring device 104 and generates power of a type (e.g., alternating current, direct current) and level (e.g., 12V, 24V, 120V) that can be used by the other components of the monitoring device 104. The power module 112 can use a closed control loop to maintain a preconfigured voltage or current with a tight tolerance at the output. The power module 112 can also protect the rest of the electronics (e.g., hardware processor 120, transceiver 124) in the monitoring device 104 from surges generated in the line.

In addition, or in the alternative, the power module 112 can be a source of power in itself to provide signals to the other components of the monitoring device 104. For example, the power module 112 can be a battery. As another example, the power module 112 can be a localized photovoltaic power system.

The hardware processor 120 of the monitoring device 104 executes software, algorithms, and firmware in accordance with one or more example embodiments. Specifically, the hardware processor 120 can execute software on the monitoring engine 106 or any other portion of the monitoring device 104, as well as software used by the user 150, the network manager 180, the diagnostic device 170, and/or one or more of the electrical devices 160. The hardware processor 120 can be an integrated circuit, a central processing unit, a multi-core processing chip, SoC, a multi-chip module including multiple multi-core processing chips, or other hardware processor in one or more example embodiments. The hardware processor 120 is known by other names, including but not limited to a computer processor, a microprocessor, and a multi-core processor.

In one or more example embodiments, the hardware processor 120 executes software instructions stored in memory 122. The memory 122 includes one or more cache memories, main memory, and/or any other suitable type of memory. The memory 122 can include volatile and/or non-volatile memory. The memory 122 is discretely located within the monitoring device 104 relative to the hardware processor 120 according to some example embodiments. In certain configurations, the memory 122 can be integrated with the hardware processor 120.

In certain example embodiments, the monitoring device 104 does not include a hardware processor 120. In such a case, the monitoring device 104 can include, as an example, one or more field programmable gate arrays (FPGA), one or more integrated-gate bipolar transistors (IGBTs), and/or one or more integrated circuits (ICs). Using FPGAs, IGBTs, ICs, and/or other similar devices known in the art allows the monitoring device 104 (or portions thereof) to be programmable and function according to certain logic rules and thresholds without the use of a hardware processor. Alternatively, FPGAs, IGBTs, ICs, and/or similar devices can be used in conjunction with one or more hardware processors 120.

The transceiver 124 of the monitoring device 104 can send and/or receive control and/or communication signals. Specifically, the transceiver 124 can be used to transfer data between the monitoring device 104 and the user 150, the network manager 180, the diagnostic device 170, and/or the electrical devices 160. The transceiver 124 can use wired and/or wireless technology. The transceiver 124 can be configured in such a way that the control and/or communication signals sent and/or received by the transceiver 124 can be received and/or sent by another transceiver that is part of the user 150, the network manager 180, the diagnostic device 170, and/or the electrical devices 160. The transceiver 124 can use any of a number of signal types, including but not limited to radio frequency signals.

When the transceiver 124 uses wireless technology, any type of wireless technology can be used by the transceiver 124 in sending and receiving signals. Such wireless technology can include, but is not limited to, Wi-Fi, visible light communication, cellular networking, and Bluetooth. The transceiver 124 can use one or more of any number of suitable communication protocols (e.g., ISA100, HART) when sending and/or receiving signals. Such communication protocols can be stored in the protocols 132 of the storage repository 130. Further, any transceiver information for the user 150, the network manager 180, and/or the diagnostic device 170 can be part of the stored data 134 (or similar areas) of the storage repository 130.

Optionally, in one or more example embodiments, the security module 128 secures interactions between the monitoring device 104, the user 150, the network manager 180, and/or the diagnostic device 170. More specifically, the security module 128 authenticates communication from software based on security keys verifying the identity of the source of the communication. For example, user software may be associated with a security key enabling the software of the user 150 to interact with the monitoring device 104 and/or the diagnostic device 170. Further, the security module 128 can restrict receipt of information, requests for information, and/or access to information in some example embodiments.

As stated above, the monitoring device 104 can be placed in any of a number of environments. In such a case, the housing of the monitoring device 104 can be configured to comply with applicable standards for any of a number of environments. For example, the monitoring device 104 can be rated as a Division 1 or a Division 2 enclosure under NEC standards. Similarly, any of the electrical devices 160 or other devices communicably coupled to the monitoring device 104 can be configured to comply with applicable standards for any of a number of environments.

Figure 2:
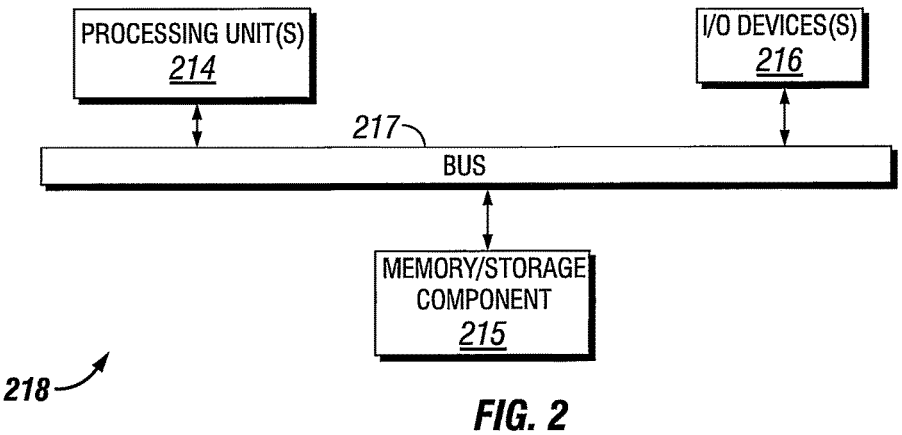
FIG. 2 shows a computing device in accordance with certain example embodiments.

FIG. 2 illustrates one embodiment of a computing device 218 that implements one or more of the various techniques described herein, and which is representative, in whole or in part, of the elements described herein pursuant to certain exemplary embodiments. Computing device 218 is one example of a computing device and is not intended to suggest any limitation as to scope of use or functionality of the computing device and/or its possible architectures. Neither should computing device 218 be interpreted as having any dependency or requirement relating to any one or combination of components illustrated in the example computing device 218.

Computing device 218 includes one or more processors or processing units 214, one or more memory/storage components 215, one or more input/output (I/O) devices 216, and a bus 217 that allows the various components and devices to communicate with one another. Bus 217 represents one or more of any of several types of bus structures, including a memory bus or memory controller, a peripheral bus, an accelerated graphics port, and a processor or local bus using any of a variety of bus architectures. Bus 217 includes wired and/or wireless buses.

Memory/storage component 215 represents one or more computer storage media. Memory/storage component 215 includes volatile media (such as random access memory (RAM)) and/or nonvolatile media (such as read only memory (ROM), flash memory, optical disks, magnetic disks, and so forth). Memory/storage component 215 includes fixed media (e.g., RAM, ROM, a fixed hard drive, etc.) as well as removable media (e.g., a Flash memory drive, a removable hard drive, an optical disk, and so forth).

One or more I/O devices 216 allow a customer, utility, or other user to enter commands and information to computing device 218, and also allow information to be presented to the customer, utility, or other user and/or other components or devices. Examples of input devices include, but are not limited to, a keyboard, a cursor control device (e.g., a mouse), a microphone, a touchscreen, and a scanner. Examples of output devices include, but are not limited to, a display device (e.g., a monitor or projector), speakers, outputs to a lighting network (e.g., DMX card), a printer, and a network card.

Various techniques are described herein in the general context of software or program modules. Generally, software includes routines, programs, objects, components, data structures, and so forth that perform particular tasks or implement particular abstract data types. An implementation of these modules and techniques are stored on or transmitted across some form of computer readable media. Computer readable media is any available non-transitory medium or non-transitory media that is accessible by a computing device. By way of example, and not limitation, computer readable media includes "computer storage media".

"Computer storage media" and "computer readable medium" include volatile and non-volatile, removable and non-removable media implemented in any method or technology for storage of information such as computer readable instructions, data structures, program modules, or other data. Computer storage media include, but are not limited to, computer recordable media such as RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which is used to store the desired information and which is accessible by a computer.

The computer device 218 is connected to a network (not shown) (e.g., a LAN, a WAN, the Internet, the cloud, or any other similar type of network) via a network interface connection (not shown) according to some exemplary embodiments. Those skilled in the art will appreciate that many different types of computer systems exist (e.g., desktop computer, a laptop computer, a personal media device, a mobile device, such as a cell phone or personal digital assistant, or any other computing system capable of executing computer readable instructions), and the aforementioned input and output means take other forms, now known or later developed, in other exemplary embodiments. Generally speaking, the computer system 218 includes at least the minimal processing, input, and/or output means necessary to practice one or more embodiments.

Further, those skilled in the art will appreciate that one or more elements of the aforementioned computer device 218 is located at a remote location and connected to the other elements over a network in certain exemplary embodiments. Further, one or more embodiments is implemented on a distributed system having one or more nodes, where each portion of the implementation (e.g., monitoring engine 106) is located on a different node within the distributed system. In one or more embodiments, the node corresponds to a computer system. Alternatively, the node corresponds to a processor with associated physical memory in some exemplary embodiments. The node alternatively corresponds to a processor with shared memory and/or resources in some exemplary embodiments.

Figure 3:
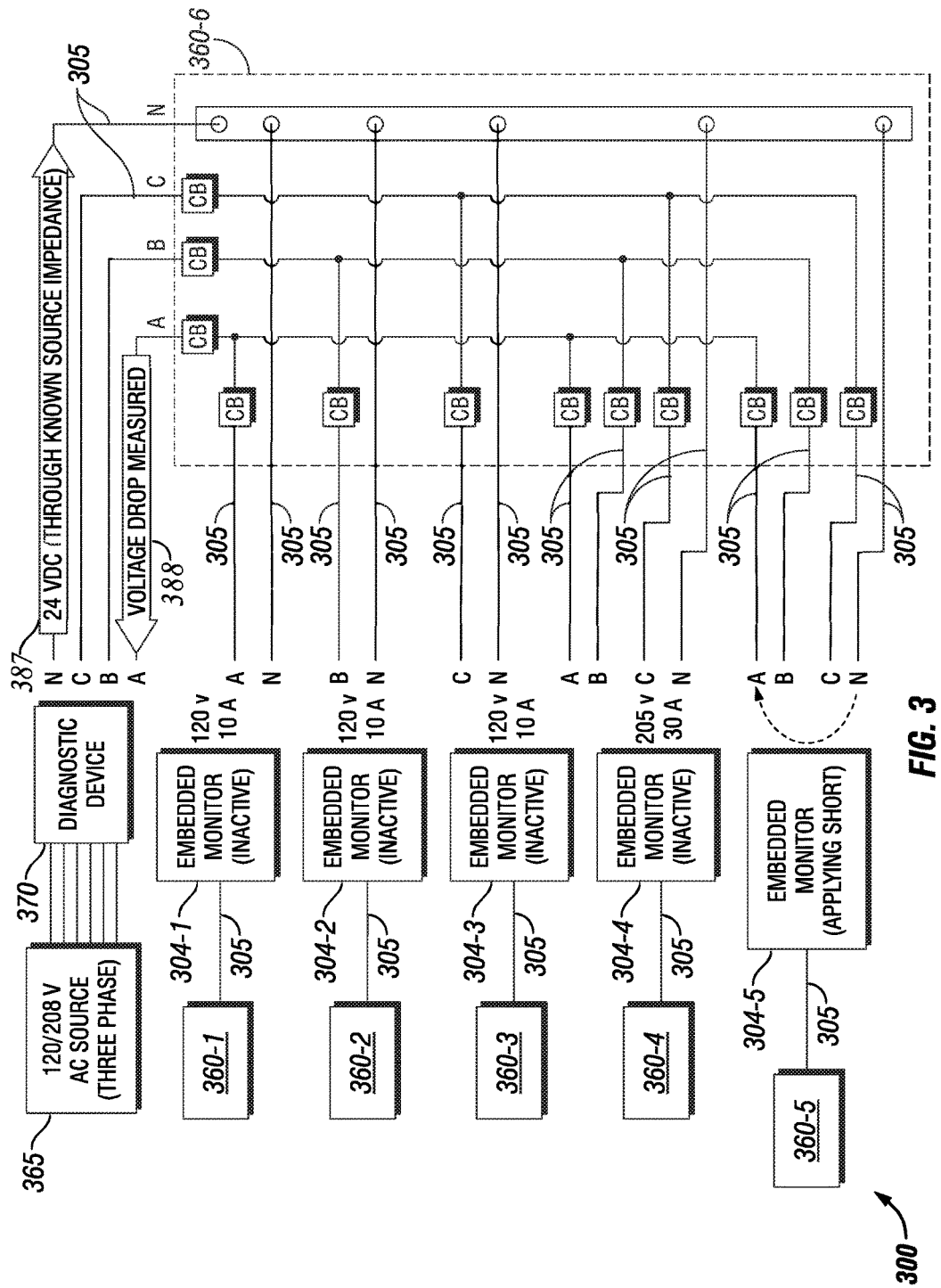
FIG. 3 shows a block diagram of an electrical network in accordance with certain example embodiments.

FIG. 3 shows a block diagram of an electrical network 300 in accordance with certain example embodiments. Referring to FIGS. 1-3, the electrical network 300 of FIG. 3 includes a power source 365, a diagnostic device 370, four energy transfer links 305 (in this case, electrical conductors)

coupled to the diagnostic device 370 and terminating in an electrical device 360-6 (in this case, a junction box), a number of other energy transfer links 305 that feed from the electrical device 306-6 to five monitoring devices 304 (monitoring device 304-1, monitoring device 304-2, monitoring device 304-3, monitoring device 304-4, and monitoring device 304-5).

Each monitoring device 304 is coupled to an electrical device 360 using energy transfer links 305. In this case, monitoring device 304-1 is coupled to electrical device 360-1 using energy transfer link 305, monitoring device 304-2 is coupled to electrical device 360-2 using energy transfer link 305, monitoring device 304-3 is coupled to electrical device 360-3 using energy transfer link 305, monitoring device 304-4 is coupled to electrical device 360-4 using energy transfer link 305, and monitoring device 304-5 is coupled to electrical device 360-5 using energy transfer link 305.

A monitoring device 304 in FIG. 3 can be embedded in the electrical system 300 or installed as shown while the electrical system 300 (or portion thereof) is de-energized. The diagnostic device 370 can receive power from the power source 365 and generate test signals 387 (in this case, 24 V DC). The test signals 387 can be applied to one or more of the energy transfer links 305 (electrical conductors). For example, in this case, the test signals 387 are applied to the neutral leg that feeds the electrical device 306-6 (junction box).

The test signals 387 generated by the diagnostic device 370 can be addressed to one or more particular monitoring devices 304. For example, in this case, while monitoring device 304-1, monitoring device 304-2, monitoring device 304-3, monitoring device 304-4, and monitoring device 304-5 are each electrically coupled to the neutral conductor to which the test signals 387 are applied by the diagnostic device 370, only monitoring device 304-5 becomes active in response to the test signals 387, while monitoring device 304-1, monitoring device 304-2, monitoring device 304-3, and monitoring device 304-4 remain inactive, essentially ignoring the test signals 387.

When a test signal 387 is received by a recipient monitoring device 304, the recipient monitoring device 304 can send a reply signal 388 acknowledging receipt of the test signal 387. In such a case, the diagnostic device 370 can send another test signal 387 addressed to the recipient monitoring device 304 with instructions for the recipient monitoring device 304 to execute (implement) one or more of a number of test procedures. Alternatively, the initial test signal 387 can include, along with the address of the recipient monitoring device 304, such instructions for the recipient monitoring device 304 to execute the test procedures.

A test procedure can be any of a number of actions taken by a recipient monitoring device 304 to test an aspect of the electrical circuit that includes the downstream electrical device 360 associated with the recipient monitoring device 304. Each test procedure can be embedded in the test signals 387, a protocol 132 stored in the storage repository 130 of the monitoring device 304, and/or obtained in any of a number of other ways. An example of an action taken by a recipient monitoring device 304 as part of a test procedure is applying a short across two energy transfer links 305 (e.g., the neutral and A-phase electrical conductors).

Once the recipient monitoring device 304 executes a test procedure, the test signal 387 sent by the diagnostic device 370 has a return path to the diagnostic device. The signal that returns after flowing through the circuitry manipulated by the recipient monitoring device 304 as part of the test procedure is a return signal 388. The diagnostic device 370, upon receiving a return signal 388, can analyze the return signal 388 (e.g., based on the test procedure executed by the recipient monitoring device 304, by comparing the return signal 388 to the test signal 387) to determine a condition of the downstream electrical device 360 and its associated circuitry (e.g., energy transfer links 305).

For example, the impedance along the path traveled by the test signal 387 and the corresponding return signal 388 can be known or otherwise determined. In such a case, the voltage drop of the return signal 388 relative to the test signal 387 can be determined and analyzed by the diagnostic device 370. If the voltage drop is high, this could represent an open circuit. When multiple phases are involved, the superposition of two phases can identify which phase requires service. For example, a large drop voltage measured on A-B and on B-C indicates that B phase requires service.

As a specific example in order to verify single and/or three-phase voltage connections, the diagnostic device 370 can be connected to the power source 365 as well as to all three phases (via three energy transfer links 305) of a 208VAC supply, which is also powering three single phase 120V lines (energy transfer links 305). In addition, one monitoring device 304 is wired to the energy transfer links 305 that carry the three phase voltages, and two other monitoring devices 304 are wired in parallel on the energy transfer link 305 that carries phase A-B 120VAC.

In such a case, when the downstream electrical device 360 is idle, the diagnostic device 370 sends a test signal 387 (e.g., applies 24VDC to one or more energy transfer links 305 (e.g., for a single phase of power)), and the embedded monitoring devices 304 receive the test signal 387. The diagnostic device 370 can cycle the test signal 387 in accordance with a communication protocol to query the potential embedded monitoring devices 304. Using a time-multiplexing protocol, after each embedded monitoring device 304 receives the test signal 387 (e.g., is queried), the monitoring device 304 responds by shorting the energy transfer link 305 (the voltage phase) on which the test signal 387 was sent (that has been performing the query) in accordance with the communication protocol. In this case, shorting the energy transfer link is implementing (executing, performing) a test procedure. Each test signal 387 returns to the diagnostic device 370 as a return signal 388.

The diagnostic device 370 repeats this process of sending the test signals 387 on the remaining energy transfer links 305 (the remaining voltage phases), and the recipient monitoring devices 304 execute the corresponding test procedures based on receiving those test signals 387. Similarly, each test signal 387 returns to the diagnostic device 370 as a return signal 388. Upon receiving these return signals 388, the diagnostic device 370 can then record which embedded monitoring devices 304 were present on each energy transfer link 305 (voltage line).

Any open circuits in the circuitry associated with the downstream electrical device 360 can be determined by the diagnostic device 370 when a three-phase monitoring device 304 only responds (performs a test procedure) on a single phase or on two phases. (In such a case, it is assumed that there would be separate single or three-phase test signals 387.) In addition, or in the alternative, an open in the circuitry associated with the downstream electrical device 360 can be determined by the diagnostic device 370 when a known monitoring device 304 failed to respond (did not perform a test procedure) to a query (test signal 387).

As a specific example in order to verify line resistances, the diagnostic device 370 can be connected to the power source 365 as well as to all three phases (via three energy transfer links 305) of a 208VAC supply, which is also powering three single phase 120V lines (energy transfer links 305). In addition, one monitoring device 304 is wired to the energy transfer links 305 that carry the three phase voltages, and two other monitoring devices 304 are wired in parallel on the energy transfer link 305 that carries phase A-B 120VAC.

In such a case, when the downstream electrical device 360 is idle, the diagnostic device 370 sends a test signal 387 (e.g., applies 24V to one or more energy transfer links 305 (e.g., for a single phase of power)), and the embedded monitoring devices 304 receive the test signal 387. The diagnostic device 370 can cycle the test signal 387 in accordance with a communication protocol to query the potential embedded monitoring devices 304. Using a time-multiplexing protocol, after each embedded monitoring device 304 receives the test signal 387 (e.g., is queried), the monitoring device 304 responds by shorting the energy transfer link 305 (the voltage phase) on which the test signal 387 was sent (that has been performing the query) in accordance with the communication protocol. In this case, shorting the energy transfer link is implementing (executing, performing) a test procedure. Each test signal 387 returns to the diagnostic device 370 as a return signal 388.

The diagnostic device 370 repeats this process of sending the test signals 387 on the remaining energy transfer links 305 (the remaining voltage phases), and the recipient monitoring devices 304 execute the corresponding test procedures based on receiving those test signals 387. Similarly, each test signal 387 returns to the diagnostic device 370 as a return signal 388. Upon receiving these return signals 388, the diagnostic device 370 can then record which embedded monitoring devices 304 were present on each energy transfer link 305 (voltage line).

The diagnostic device 370 can then apply a test signal 387 (e.g., 24VDC) to all three phases (all energy transfer links 305), and so all monitoring devices 304 coupled to the circuitry associated with the downstream electrical device 360 receive the test signals 387 and become activated (e.g., receive power). The diagnostic device 370 can then begin a routine of instructing a monitoring device 304 to perform a test procedure of shorting its power line (energy transfer link 305) at a known current level. Upon receiving the resulting return signal 388, the diagnostic device 370 can measure the voltage drop across the two terminals of the shorted line, and then calculate line resistance. The diagnostic device 370 can then repeat this process, instructing every monitoring device 304 to short every available phase (perform testing procesures). The diagnostic device 370 can then use each resulting return signal 388 to calculate the line resistance of every connection in the circuitry associated with the downstream electrical device 360.

In other words, the diagnostic device 370, using one or more monitoring devices 304, can determine any of a number of adverse conditions with respect to a downstream electrical device 360. Examples of such adverse conditions can include, but are not limited to, failure of the electrical device 360, a loose connection of or connected to the electrical device 360, a ground fault in the circuitry feeding the electrical device 360, and a loss of phase of or connected to the electrical device 360. The diagnostic device 370 can then communicate this adverse condition to the network manager 180, a user 150, and/or some other entity.

Figure 4:
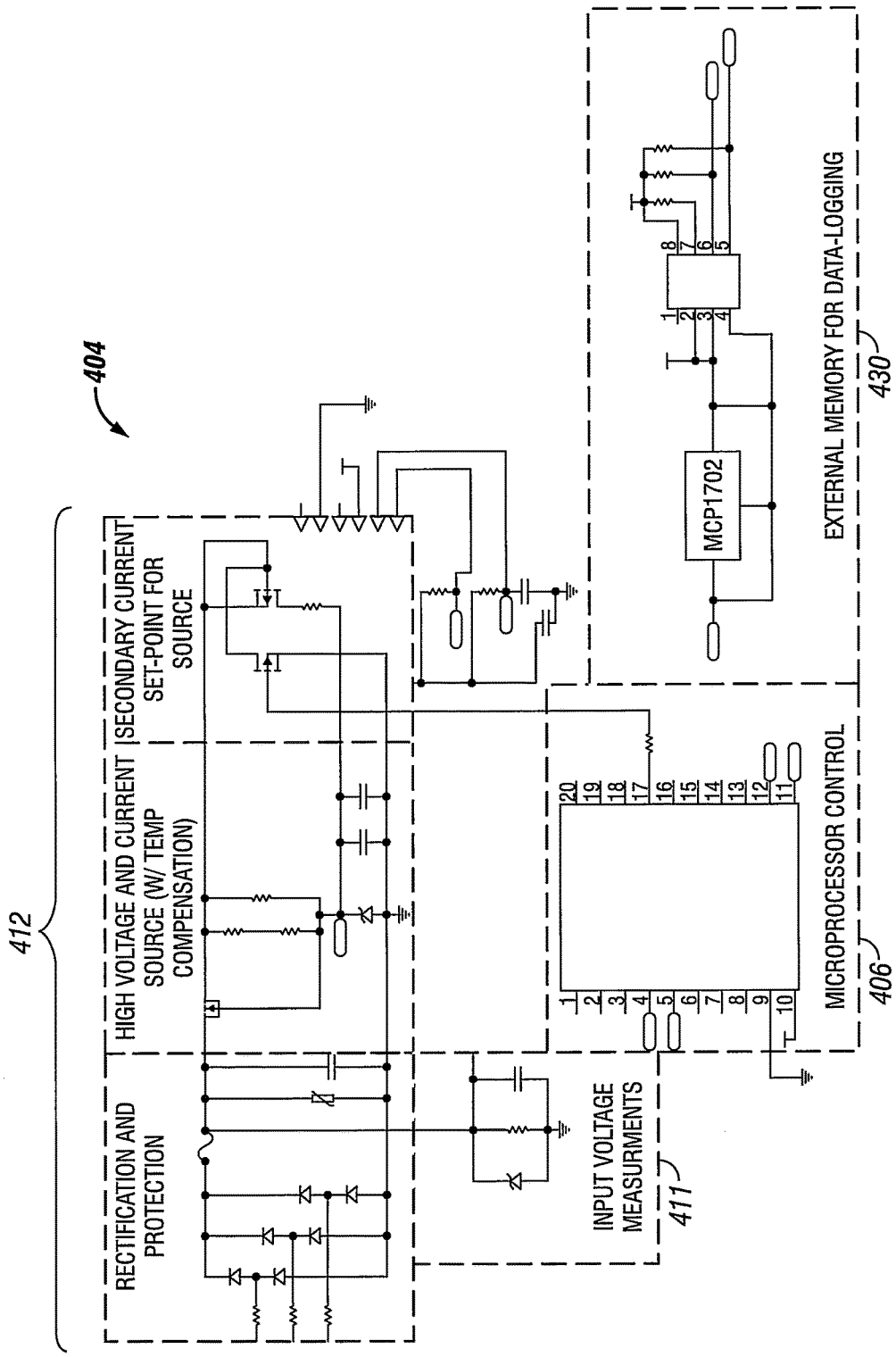
FIG. 4 shows a circuit diagram of a monitoring device in accordance with certain example embodiments.
Figure 5:
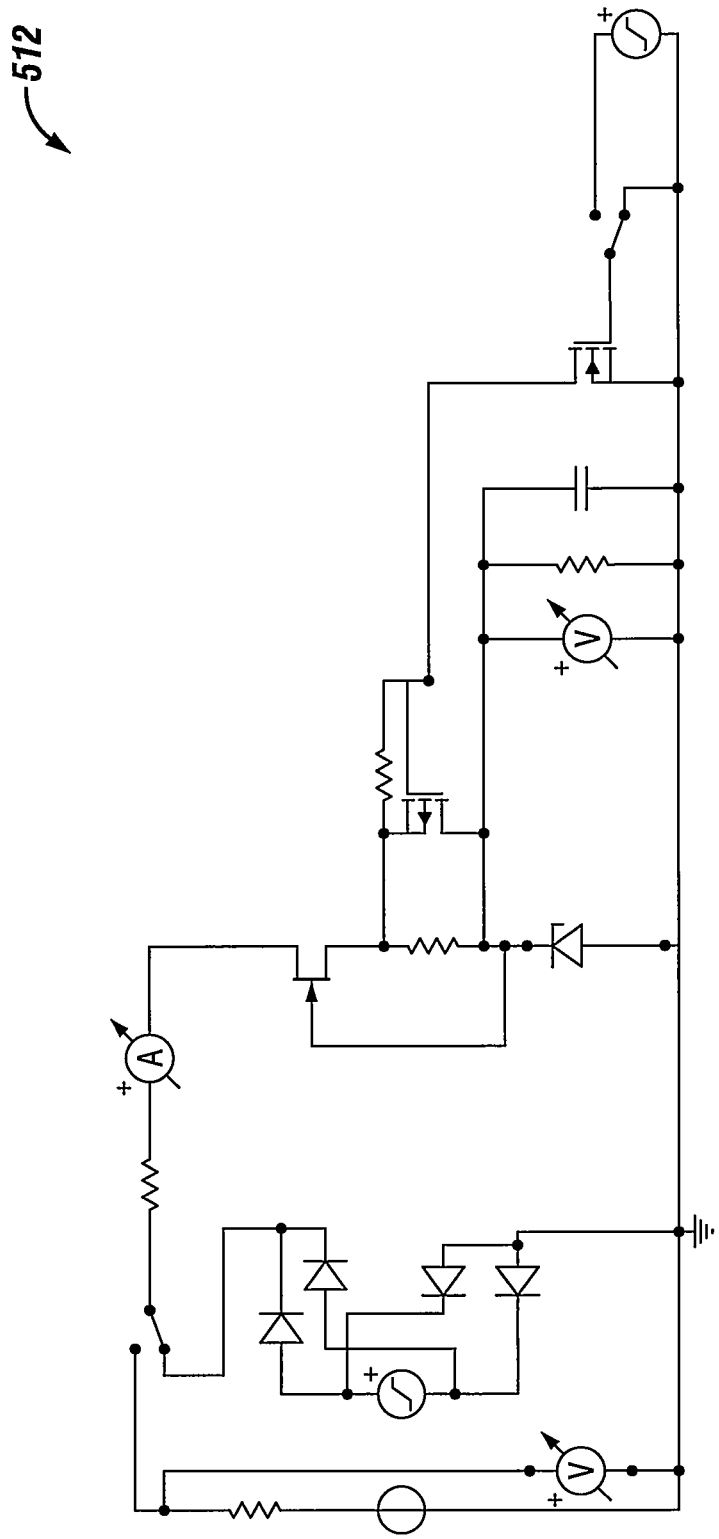
FIG. 5 shows a circuit diagram of a power module of a monitoring device in accordance with certain example embodiments.

FIG. 4 shows a circuit diagram of a monitoring device 404 in accordance with certain example embodiments. FIG. 5 shows a circuit diagram of a power module 512 of a monitoring device in accordance with certain example embodiments. Referring to FIGS. 1-5, the circuitry of the example monitoring device 404 is shown for a power module 412, an energy metering module 411, a monitoring engine 406, and a storage repository 430 are shown. The circuitry for the example power module 512 of FIG. 5 differs from that of the power module 412 of FIG. 4. Further, the power module 512 of FIG. 5 includes various components (e.g., voltmeter, ammeter) of the energy metering module of the monitoring device.

Figure 6:
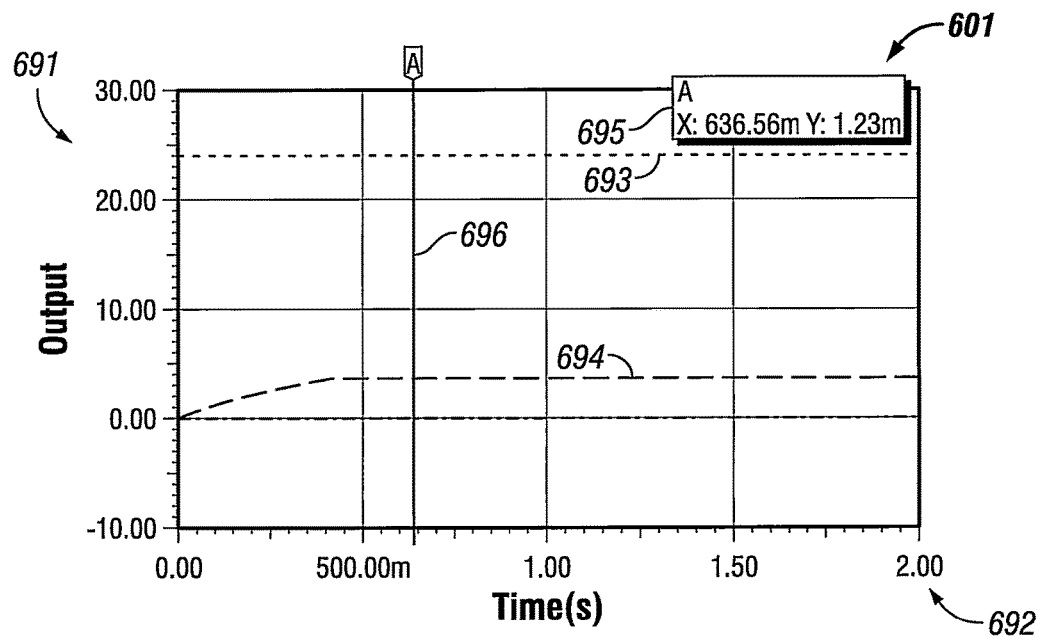
FIGS. 6-8 show graphical examples of how an example monitoring device can be used to inspect an electrical network.
Figure 7:
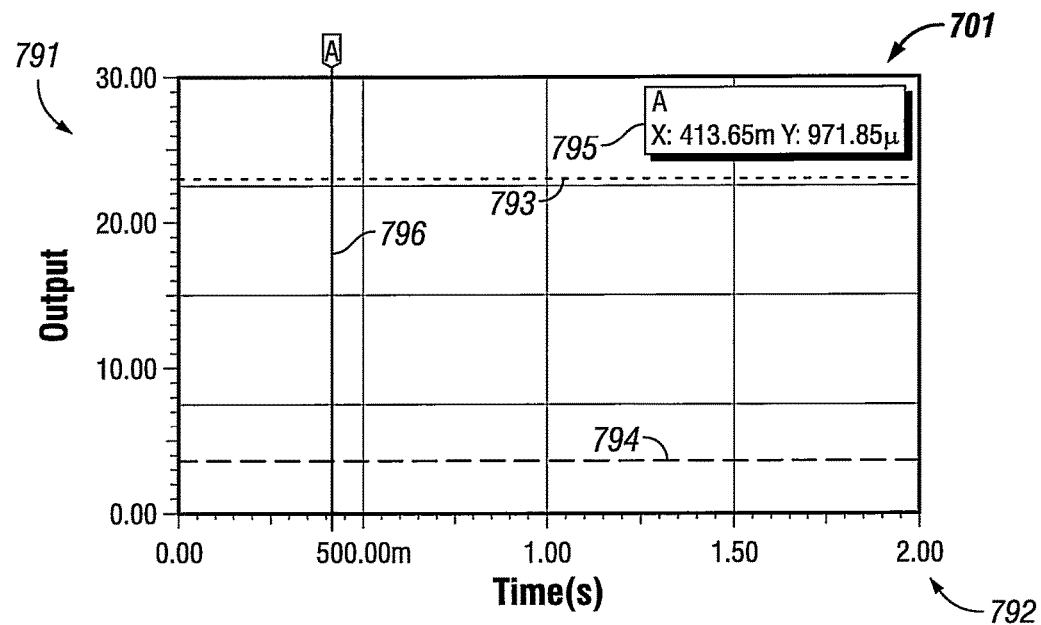
Figure 8:
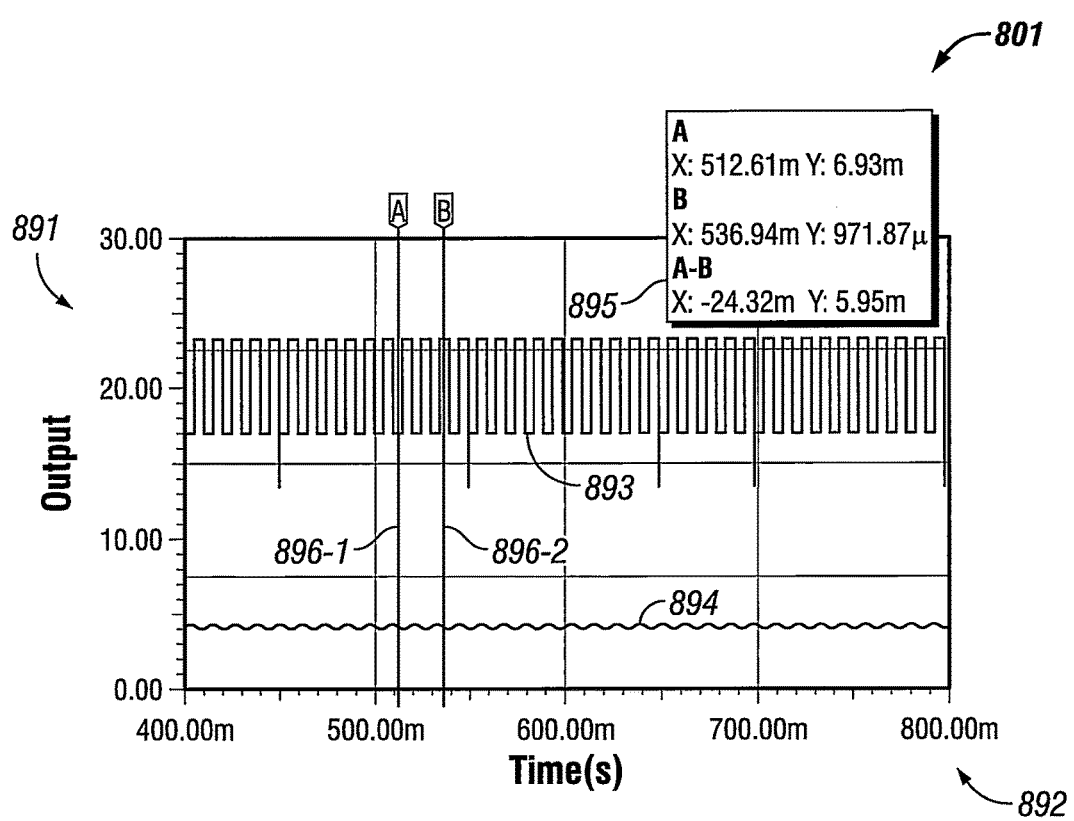

FIGS. 6-8 show graphical examples of how an example monitoring device can be used to inspect an electrical network. Referring to FIGS. 1-8, the graph 601 of FIG. 6 includes a curve 694 showing the startup and steady-state current draw of an example monitoring device in standby or sleep mode and while the associated electrical device is in service (e.g., operating on 480 VAC). The graph 601 nominally plots DC voltage 691 along the vertical axis against time 692 along the horizontal axis. The selector 696 highlights the results in the table 695, which displays current (part of a secondary horizontal axis, hidden from view) used by the monitoring device at a particular point in time 692. The current (approximately 1.3 mA) used by the monitoring device while in steady-state sleep mode allows the monitoring device to monitor the input voltage and find an abnormal operating condition (e.g., a missing phase, a dipping voltage level).

The graph 701 of FIG. 7 is substantially similar to the graph 601 of FIG. 6, except as described below. Specifically, the graph 701 of FIG. 7 shows the test signal 793 (in this case, approximately 24 VDC) as well as the current 794 (approximately 1 mA, as shown in the table 795) drawn by the monitoring device. In this case, the associated electrical device is idle (i.e., the 480 VAC operating voltage is removed). The test signal 793 is generated by the diagnostic device, and the monitoring device is in standby mode.

The graph 801 of FIG. 8 is substantially similar to the graph 701 of FIG. 7, except as described below. Specifically, the graph 801 of FIG. 8 shows the test signal 893 (varying between approximately 17 VDC and 24 VDC in a square wave pattern) as well as the current 894 (varying between 1 mA and 7 mA, as shown in the table 895) drawn by the monitoring device. In this case, the associated electrical device is still idle (i.e., the 480 VAC operating voltage is removed). The test signal 893 is generated by the diagnostic device, and the monitoring device is in active mode.

By pulsing the test signal 893, as shown in FIG. 8, data (e.g., instructions, measurements) can be sent to and received between a monitoring device 104 and the diagnostic device 170. Signals sent by the monitoring device 104 to the diagnostic device 170 can be called a return signal or return current herein. The pulsation of the test signal 893 can be short enough so as not to cause a reset in the monitoring device 104 and/or the diagnostic device 170. The higher draw in current 894 by the monitoring device 104 can be measured in the return current received by the diagnostic device 170, since the impedance is known. This gives several volts of signal to transfer data between the monitoring device 104 and the diagnostic device 170. The return signal can include one or more of any of a number of different data, including identification of the monitoring device 104, historical data, and fault conditions detected.

Example embodiments can inspect (test) one or more electrical devices in a system when those electrical devices are idle. Example embodiments can perform one or more functions (e.g., apply a short) when an electrical device is being tested. Example embodiments can communicate with a diagnostic device to provide information as to aspects of the electrical device that may require a user's attention. Example embodiments can save time and resources while efficiently and automatically inspecting electrical equipment before that equipment is put into service.

Example embodiments can improve safety by detecting open power lines, detected an abnormal level of power line resistance, identify specific electrical equipment that has been monitored and tested (as well as any identified issues), and identify single phase and/or phase-to-phase loss of operation. Example embodiments can also log and communicate data collected while inspecting an electrical device. Example embodiments can also save money by automatically performing inspection functions, reducing the need for maintenance personnel from performing these functions.

Although embodiments described herein are made with reference to example embodiments, it should be appreciated by those skilled in the art that various modifications are well within the scope and spirit of this disclosure. Those skilled in the art will appreciate that the example embodiments described herein are not limited to any specifically discussed application and that the embodiments described herein are illustrative and not restrictive. From the description of the example embodiments, equivalents of the elements shown therein will suggest themselves to those skilled in the art, and ways of constructing other embodiments using the present disclosure will suggest themselves to practitioners of the art. Therefore, the scope of the example embodiments is not limited herein.

What is claimed is:

1. An electrical system, comprising:
a diagnostic device that generates a first test signal;
a plurality of energy transfer links coupled to the diagnostic device, wherein the first test signal flows through a first subset of the plurality of energy transfer links;
a first embedded monitoring device coupled to the first subset of the plurality of energy transfer links, wherein the first embedded monitoring device receives the first test signal from the diagnostic device through the first subset of the plurality of energy transfer links; and
a first electrical device coupled to the first embedded monitoring device, wherein the first electrical device is fed from a first circuit breaker in communication with the first electrical device and the diagnostic device,
wherein the first embedded monitoring device implements a first test procedure based on the first test signal, wherein the first test procedure helps determine a first condition of the first electrical device.

2. The electrical system of claim 1, wherein the diagnostic device receives, during the first test procedure, a first return signal through the first subset of the plurality of energy transfer links, wherein the diagnostic device uses the first return signal to determine the first condition of the first electrical device.

3. The electrical system of claim 2, wherein the diagnostic device determines, based on first results of the first test procedure, an adverse condition associated with the first electrical device, wherein the adverse condition comprises at least one of a group consisting of failure of the electrical device, a loose connection, a ground fault, and a loss of phase.

4. The electrical system of claim 3, wherein the first results of the first test procedure implemented on the first electrical device are among a plurality of first results received over time, wherein the diagnostic device analyzes the plurality of first results to determine whether the first electrical device is failing.

5. The electrical system of claim 1, wherein the first test procedure comprises shorting, by the first embedded monitoring device in response to the first test signal, the first subset of the plurality of the energy transfer links to each other.

6. The electrical system of claim 1, wherein the first subset comprises three phases and a neutral line, wherein the test procedure comprises individually testing each phase-to-phase and each phase-to-neutral combination.

7. The electrical system of claim 1, wherein the first test signal comprises 24 V direct current.

8. The electrical system of claim 1, wherein the first test procedure is applied when the first electrical device is idle.

9. The electrical system of claim 1, wherein the first electrical device is coupled to the first subset of the plurality of energy transfer links.

10. The electrical system of claim 9, wherein the first embedded monitoring device is disposed between the first electrical device and the diagnostic device.

11. The electrical system of claim 1, wherein the first embedded monitoring device is among a plurality of embedded monitoring devices that are coupled to the diagnostic device, wherein the first test signal is addressed to the first embedded monitoring device and ignored by a remainder of the plurality of embedded monitoring devices.

12. The electrical system of claim 1, wherein the first test signal is sent along a neutral line among the plurality of energy transfer links.

13. The electrical system of claim 1, wherein the first test signal activates the first embedded monitoring device.

14. The electrical system of claim 1, wherein the first embedded monitoring device switches from a low-current mode to a high-current mode when the first test signal is received.

15. The electrical system of claim 1, further comprising:
a second embedded monitoring device coupled to a second subset of energy transfer links, wherein the second embedded monitoring device receives a second test signal from the diagnostic device through the second subset of the plurality of energy transfer links; and
a second electrical device coupled to the second embedded monitoring device, wherein the second electrical device is fed from a second circuit breaker in communication with the second electrical device and the diagnostic device,
wherein the second embedded monitoring device implements a second test procedure based on the second test signal, wherein the second test procedure helps determine a second condition of the second electrical device.

16. The electrical system of claim 15, wherein the diagnostic device receives, during the second test procedure, a second return signal through the second subset of the plurality of energy transfer links, wherein the diagnostic device uses the second return signal to determine the second condition of the second electrical device.

17. An embedded monitoring device for a portion of an electrical system, the embedded monitoring device comprising:
an embedded monitoring engine configured to:
receive, on a subset of a plurality of energy transfer links, a test signal from a diagnostic device of the electrical system;
implement, in response to the test signal, a test procedure on a downstream electrical device of the electrical system using the subset of the plurality of energy transfer links, wherein the downstream electrical device comprises at least one removable mechanical connection; and send a return signal to the diagnostic device, wherein the return signal comprises results of the test procedure on the downstream electrical device, wherein the diagnostic device is configured to determine a condition of the electrical device using the results included in the return signal.

18. The embedded monitoring device of claim 17, further comprising:

a power module that switches from a low current to a high current when the embedded monitoring engine receives the test signal from the diagnostic device.

19. The embedded monitoring device of claim 17, further comprising:

a memory that stores a plurality of instructions; and a hardware processor that executes the plurality of instructions, wherein a controller determines the test procedure to implement based on the test signal and the plurality of instructions.

20. A method for testing an electrical device of an electrical system, the method comprising:

receiving, by an embedded monitoring device on a subset of a plurality of energy transfer links, a test signal from a diagnostic device of the electrical system;

implementing, by the embedded monitoring device in response to the test signal, a test procedure on a downstream electrical device of the electrical system using the subset of the plurality of energy transfer links, wherein the downstream electrical device is fed by at least one circuit breaker in communication with the embedded monitoring device and the downstream electrical device; and sending, by the embedded monitoring device, a return signal to the diagnostic device, wherein the return signal comprises results of the test procedure on the downstream electrical device, wherein the diagnostic device is configured to determine a condition of the electrical device using the results included in the return signal.

\* \* \* \* \*